United States Patent
Yen

(10) Patent No.: US 7,388,532 B2
(45) Date of Patent: Jun. 17, 2008

(54) OVERDRIVE DIGITAL-TO-ANALOG CONVERTER, SOURCE DRIVER AND METHOD THEREOF

(75) Inventor: Chih-Jen Yen, Hsinchu City (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/556,173

(22) Filed: Nov. 3, 2006

(65) Prior Publication Data

US 2008/0055137 A1    Mar. 6, 2008

(30) Foreign Application Priority Data

Aug. 30, 2006   (TW) ............................. 95131995 A

(51) Int. Cl.
*H03M 1/66*    (2006.01)
(52) U.S. Cl. ....................................... 341/144; 341/154
(58) Field of Classification Search ................ 341/144, 341/154; 345/690, 100
See application file for complete search history.

(56) References Cited

U.S. PATENT DOCUMENTS

| | | | |
|---|---|---|---|
| 6,831,580 B2* | 12/2004 | Bae | 341/144 |
| 2005/0068343 A1* | 3/2005 | Pan et al. | 345/690 |
| 2006/0146000 A1* | 7/2006 | Choi | 345/100 |

* cited by examiner

*Primary Examiner*—Jean B Jeanglaude
(74) *Attorney, Agent, or Firm*—Jianq Chyun IP Office

(57) ABSTRACT

An overdrive digital-to-analog converter (DAC), a source driver, and a method thereof are provided. The DAC comprises a voltage divider unit, a selection unit, a buffer unit, and a detection unit. The voltage divider unit provides a plurality of reference voltages. The detection unit outputs a regulation signal according to a comparison result between a specific reference signal corresponding to an input digital signal and an output voltage output from the buffer unit. The selection unit regulates an overdrive voltage input to the buffer unit according to the regulation signal and the input digital signal. Accordingly, the output voltage of the buffer unit is changed quickly, and the conversion speed of the DAC is improved.

35 Claims, 9 Drawing Sheets

OVERDRIVE DIGITAL-TO-ANALOG CONVERTER, SOURCE DRIVER AND METHOD THEREOF

CROSS-REFERENCE TO RELATED APPLICATION

This application claims the priority benefit of Taiwan application serial no. 95131995, filed Aug. 30, 2006. All disclosure of the Taiwan application is incorporated herein by reference.

BACKGROUND OF THE INVENTION

1. Field of the Invention

The present invention relates to a digital-to-analog converter (DAC). More particularly, the present invention relates to a DAC capable of improving conversion speed, a source driver, and a method thereof.

2. Description of Related Art

Conventional DACs usually adopt a decoder to output a corresponding analog voltage according to an input digital signal. A reference voltage can be generated by means of resistors connected in series. By dividing the voltage with the resistors, the reference voltage corresponding to the input digital signal can be generated. When the input digital signal changes, the decoder switches to the corresponding reference voltage, and a voltage buffer outputs a corresponding analog voltage.

In source drivers of a liquid crystal display (LCD), the conversion speed of the DAC directly influences the display quality of the LCD. As the DAC needs to drive pixels in a panel, and the conversion speed of pixel voltage is determined by the driving capability of the DAC. Therefore, when the load on the panel end increases, the driving current required by the DAC also increases, and the conversion speed becomes lower, thus further influencing the display quality of the LCD.

FIG. 1 shows a DAC according to the conventional art. The DAC 100 includes a voltage divider unit 110, a selection unit 120, and a buffer unit 130, and generates an output voltage VOUT according to an M-bit input digital signal DAS, where M is a positive integer. The voltage divider unit 110 uses resistors $R(1)$-$R(2^M+1)$ to generate reference voltages $V(1)$-$V(2^M)$ between an upper limit voltage VU and a lower limit voltage VD. The reference voltages $V(1)$-$V(2^M)$ are coupled to the buffer unit 130 via switches $S(1)$-$S(2^M)$ in the selection unit 120. The decoder 122 selectively turns on one of the switches $S(1)$-$S(2^M)$ according to the input digital signal DAS. Next, the buffer unit 130 generates the output voltage VOUT according to the reference voltages $V(1)$-$V(2^M)$ corresponding to the input digital signal DAS.

The buffer unit 130 is constituted by an operational amplifier 135. Under ideal conditions, the output voltage VOUT changes with the change of value of the input digital signal DAS. However, a load capacitor $C_L$ that needs to be driven by the buffer unit 130 impacts the conversion speed of the output voltage VOUT. The greater the capacitance of the load capacitor $C_L$ is, the lower the slew rate of the buffer unit 130 will be.

With the increase of the size of the LCD panel, the capacitance of the load capacitor that needs to be driven by the source driver increases. Thus, the problem that the lower conversion speed of the DAC due to the load capacitor becomes more obvious, thereby further adversely influencing the display quality of the LCD.

SUMMARY OF THE INVENTION

The present invention is directed to an overdrive DAC, which compares an output voltage and a reference voltage corresponding to an input digital signal, and regulates an input voltage of a buffer unit according to a comparison result, thereby improving the slew rate of the buffer unit and increasing the conversion speed of the DAC.

The present invention is also directed to an overdrive DAC applicable to a source driver of an LCD panel. The input voltage of the buffer unit is regulated according to the comparison result between the reference voltage corresponding to the input digital signal and the output voltage, so as to improve the driving capability and the conversion speed of the source driver.

The present invention is further directed to an overdrive DAC applicable to a source driver of an LCD panel. The input voltage of the buffer unit is regulated by detecting a difference between the voltages at an input terminal and an output terminal of the buffer unit, so as to improve the driving capability and the conversion speed of the source driver. Moreover, a decoder is used to select different output voltages. Thus, the number of the buffer units of the source drivers is reduced.

The present invention is also directed to a digital-to-analog conversion method. The input voltage of the buffer unit is regulated by detecting the change of the analog voltage corresponding to the input digital signal, such that the output voltage can quickly reach the analog voltage corresponding to the input digital signal received by the DAC.

In order to achieve the aforementioned and other objectives, the present invention provides a DAC, which includes a voltage divider unit, a selection unit, a buffer unit, and a detection unit. The voltage divider unit is used to provide an upper limit voltage, a lower limit voltage, and a plurality of reference voltages between the upper limit voltage and the lower limit voltage. The selection unit is coupled to the voltage divider unit, so as to output an overdrive voltage and a specific reference voltage corresponding to an input digital signal from among the reference voltages. The buffer unit is coupled to the selection unit, and generates an output voltage according to the overdrive voltage. The detection unit is coupled to the selection unit and the buffer unit, so as to compare the output voltage and the specific reference voltage and to output a regulation signal to the selection unit. The selection unit regulates the overdrive voltage according to the regulation signal and the input digital signal, such that the output voltage reaches the analog voltage corresponding to the input digital signal quickly. If the output voltage is lower than the specific reference voltage, the selection unit makes the overdrive voltage higher than the specific reference voltage. If the output voltage is higher than the specific reference voltage, the selection unit makes the overdrive voltage lower than the specific reference voltage. And if the output voltage equals to the specific reference voltage, the selection unit makes the overdrive voltage equal to the specific reference voltage.

In order to achieve the aforementioned and other objectives, the present invention provides a DAC, which includes a voltage divider unit, a plurality of overdrive units, and a plurality of buffer units. The voltage divider unit is used to provide an upper limit voltage, a lower limit voltage, and a plurality of reference voltages between the upper limit voltage and the lower limit voltage. The plurality of overdrive units is coupled to the voltage divider unit to output a plurality of overdrive voltages. The plurality of buffer units is coupled to the plurality of overdrive units to generate a plurality of output voltages according to the plurality of overdrive voltages. Each of the overdrive units compares individual output voltages and the reference voltages according to the input digital signals, so as to regulate individual overdrive voltages, such that each of the output voltages reaches the analog voltage corresponding to individual digital signals received by corresponding individual overdrive units.

In another embodiment of the present invention, the above overdrive unit includes a selection unit and a detection unit. The selection unit is coupled to the voltage divider unit, and the selection unit has a first output terminal and a second output terminal, wherein the first output terminal is used to output the overdrive voltage and the second output terminal is used to output a specific reference voltage corresponding to the input digital signal from among the reference voltages. The detection unit is coupled to the selection unit and the buffer unit, and the detection unit compares the output voltage and the corresponding specific reference voltage to output a regulation signal to the selection unit. The selection unit regulates the overdrive voltage according to the regulation signal and the input digital signal, such that the output voltage of the corresponding buffer unit reaches the reference voltage corresponding to the input digital signal quickly.

In order to achieve the aforementioned and other objectives, the present invention provides a DAC, which includes a voltage divider unit, a plurality of overdrive units, a plurality of buffer units, and a decoding unit. The voltage divider unit is used to provide an upper limit voltage, a lower limit voltage, and a plurality of reference voltages between the upper limit voltage and the lower limit voltage. The plurality of overdrive units is coupled to the voltage divider unit to output a plurality of overdrive voltages. The plurality of buffer units is coupled to the plurality of overdrive units to generate a plurality of first output voltages according to the plurality of overdrive voltages. The decoding unit is coupled to the plurality of buffer units to receive the plurality of first output voltages output from the plurality of buffer units, and outputs a plurality of corresponding second output voltages according to a plurality of input digital signals. Each of the second output voltages is equal to one of the first output voltages. Each of the overdrive units compares the corresponding first output voltage and the corresponding reference voltage, so as to regulate the corresponding overdrive voltage, such that the second output voltage quickly reaches the reference voltage corresponding to the input digital signal.

In an embodiment of the present invention, the decoding unit includes a plurality of decoders. Each of the decoders is coupled to the plurality of first output voltages, and outputs a corresponding second output voltage according to the input digital signal. The overdrive unit includes a selection unit and a detection unit.

In order to achieve the aforementioned and other objectives, the present invention provides a source driver, which includes a driving unit and a DAC. The driving unit outputs digital signals according to input display signals, and the DAC is coupled to the driving unit to generate a plurality of output voltages according to the digital signals output from the driving unit. The DAC compares the output voltages and the reference voltages corresponding to the digital signals. If the output voltages are not corresponding with the reference voltages corresponding to the digital signal, the DAC regulates the output voltages to reach the reference voltages corresponding to the digital signals quickly.

In order to achieve the aforementioned and other objectives, the present invention provides a digital-to-analog conversion method, which includes the following steps. First, an upper limit voltage, a lower limit voltage, and a plurality of reference voltages between the upper limit voltage and the lower limit voltage are provided. Next, a corresponding specific reference voltage among the reference voltages is outputted according to the input digital signal. Afterward, the output voltage and the specific reference voltage are compared, and a regulation signal is output. Next, an overdrive voltage is generated according to the regulation signal and the input digital signal. The output voltage quickly reaches the reference voltage corresponding to the input digital signal according to the overdrive voltage.

The present invention regulates the input voltage of the buffer unit in real time according to the comparison result between the output voltage and the reference voltage corresponding to the input digital signal, so as to improve the slew rate and the conversion speed of the buffer unit. Therefore, the present invention can improve the conversion speed of the DAC significantly without increasing the power consumption, and improve the display quality when the source driver drives the panel.

In order to make the aforementioned and other objects, features and advantages of the present invention comprehensible, preferred embodiments accompanied with figures is described in detail below.

DESCRIPTION OF EMBODIMENTS

Figure 2A:
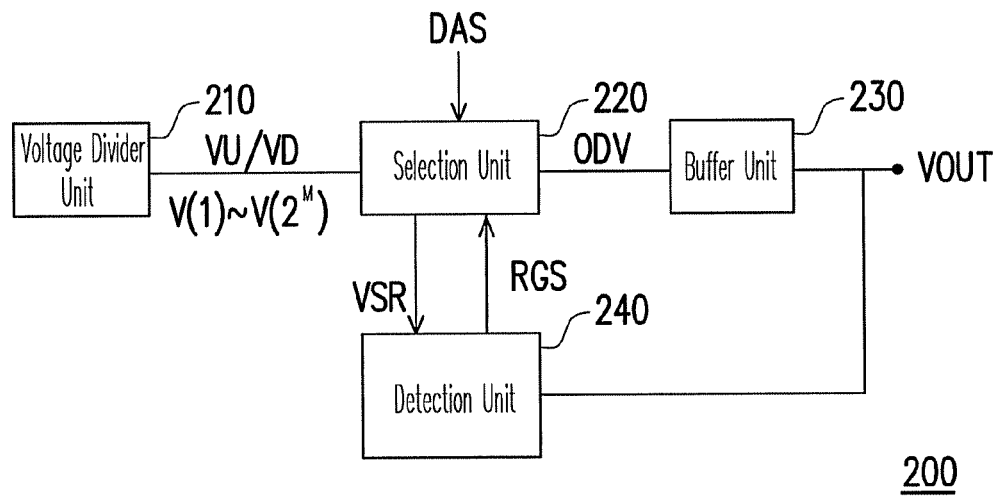
FIG. 2A is a block view of a DAC according to an embodiment of the present invention.

FIG. 2A is a block view of a DAC according to an embodiment of the present invention. The DAC 200 generates a corresponding analog output voltage VOUT according to an input digital signal DAS. The DAC 200 includes a voltage divider unit 210, a selection unit 220, a detection unit 240 and a buffer unit 230. The selection unit 220 is coupled to the voltage divider unit 210 and the buffer unit 230. The detection unit 240 is coupled to the selection unit 220 and the buffer unit 230.

The voltage divider unit 210 is used to provide an upper limit voltage VU, and a lower limit voltage VD, and reference voltages $V(1)$-$V(2^M)$ corresponding to the value of input digital signal DAS. In this embodiment, the input digital signal DAS is an M-bit signal. In other words, different input digital signals DAS correspond to different reference voltages V(1)-V($2^M$). The selection unit 220 provides a specific reference voltage VSR to the detection unit 240 according to the input digital signal DAS. The specific reference voltage VSR is one of the reference voltages V(1)-V($2^M$), and corresponds to the input digital signal DAS.

Moreover, the selection unit 220 outputs an overdrive voltage ODV to the buffer unit 230 from another output terminal, and the buffer unit 230 generates an output voltage VOUT according to the overdrive voltage ODV. In this embodiment, when the overdrive voltage ODV changes, the output voltage VOUT changes accordingly, and the speed of the change is relative to the driving capability of the buffer unit 230.

The detection unit 240 is used to compare the output voltage VOUT of the buffer unit 230 and the specific reference voltage VSR. Next, a regulation signal RGS is output to the selection unit 220 according to the comparison result, and the selection unit 220 regulates the overdrive voltage ODV according to the input digital signal DAS and the regulation signal RGS, such that the output voltage VOUT quickly reaches the reference voltage corresponding to the input digital signal DAS. In this embodiment, the regulation signal RGS can use a voltage-up signal, a voltage-down signal, and a restoring signal to represent the comparison result between the output voltage VOUT and the specific reference voltage VSR. If the output voltage VOUT is lower than the specific reference voltage VSR, the voltage-up signal is enabled, and the selection unit 220 regulates the overdrive voltage ODV accordingly so as to male the overdrive voltage ODV to be higher than the specific reference voltage VSR. If the output voltage VOUT is greater than the specific reference voltage VSR, the voltage-down signal is enabled, and the selection unit 220 regulates the overdrive voltage ODV accordingly, so as to make the overdrive voltage ODV to be lower than the specific reference voltage VSR. If the output voltage VOUT is equal to the specific reference voltage VSR, the restoring signal is enabled, and the selection unit 220 regulates the overdrive voltage ODV accordingly, so as to make the overdrive voltage ODV equal to the specific reference voltage VSR.

In other words, the selection unit 220 regulates the overdrive voltage ODV according to the regulation signal RGS, so as to improve the driving capability of the buffer unit 230 and reduce the time of changing the output voltage VOUT. When the input digital signal DAS changes, the conversion speed of the output voltage VOUT is increased.

Figure 2B:
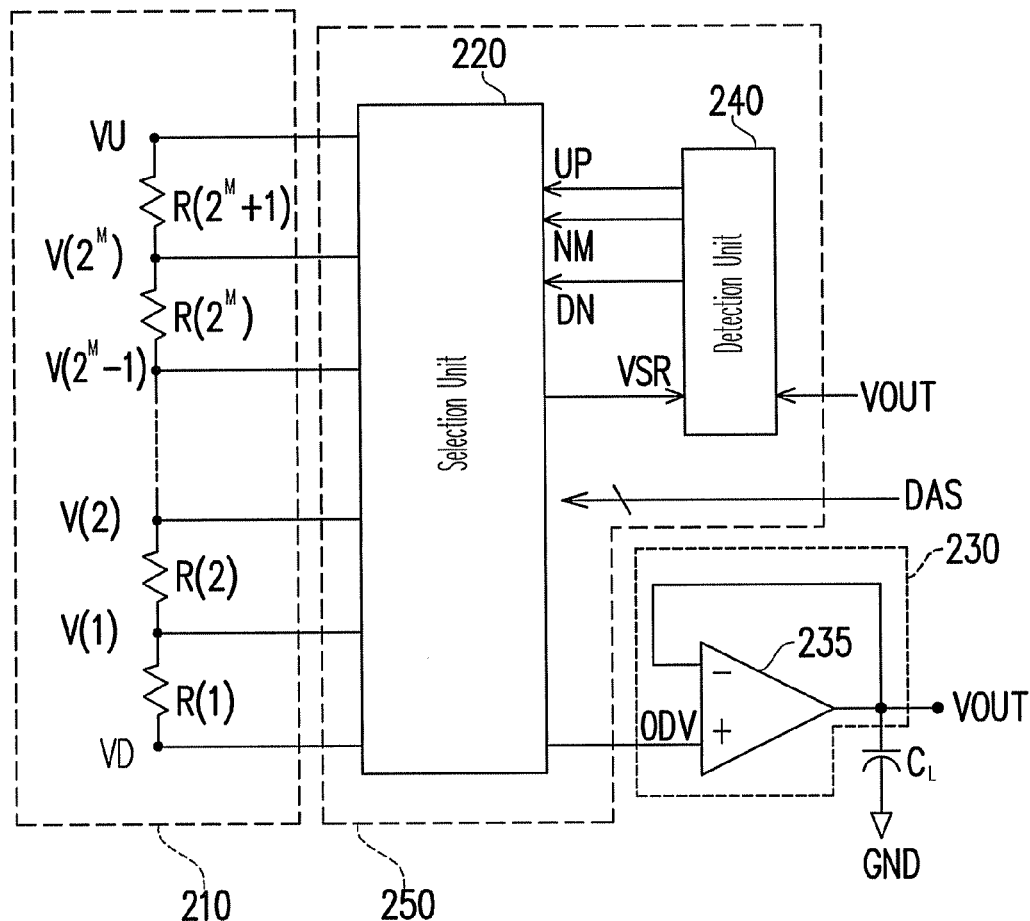
FIG. 2B is a circuit diagram of the DAC according to an embodiment of FIG. 2A.

The circuit architecture of the DAC 200 will be further illustrated below. FIG. 2B is a circuit diagram of the DAC according an embodiment of FIG. 2A. Referring to FIG. 2B, the voltage divider unit 210 is constituted of resistors R(1)-R($2^M$+1). The resistors R(1)-R($2^M$+1) are coupled between the upper limit voltage VU and the lower limit voltage VD, and output the reference voltages V(1)-V($2^M$), the upper limit voltage VU, and the lower limit voltage VD in the manner to divide the voltage. The load capacitor $C_L$ is an equivalent capacitive load at the output terminal of the buffer unit 230. In this embodiment, the buffer unit 230 can be constituted of an operational amplifier 235. A positive input terminal of the operational amplifier 235 is used to receive the overdrive voltage ODV, and a negative input terminal is coupled to an output terminal of the operational amplifier 235 to form the negative feedback architecture.

In the embodiment described with reference to FIG. 2B, the selection unit 220 and the detection unit 240 are integrally referred to as the overdrive unit 250. The overdrive unit 250 is coupled between the voltage divider unit 210 and the buffer unit 230, so as to compare the specific reference voltage VSR corresponding to the input digital signal DAS and the output voltage VOUT, and to regulate the overdrive voltage ODV according to the comparison result. Referring to FIG. 2B, the detection unit 240 outputs the voltage-up signal UP, the restoring signal NM, and the voltage-down signal DN to the selection unit 220 according to the comparison result between the specific reference voltage VSR and the output voltage VOUT. The selection unit 220 determines the value of the specific reference voltage VSR, for example, the reference voltage V(2), according to the input digital signal DAS. Next, the value of the overdrive voltage ODV is regulated according to the regulation signal RGS. If the voltage-up signal UP is enabled, the overdrive voltage ODV is regulated to be higher than the specific voltage VSR (for example, to the reference voltage V(3)). If the voltage-down signal DN is enabled, the overdrive voltage ODV is regulated to be lower than the specific reference voltage VSR (for example, to the reference voltage V(1)). If the restoring signal NM is enabled, the overdrive voltage ODV is made equal to the specific reference voltage VSR.

When the input digital signal DAS changes, the conversion time of the output voltage VOUT is impacted by the load capacitor $C_L$ to be driven. When the input digital signal changes, the output voltage VOUT may be lower or higher than the specific reference voltage VSR. Therefore, the selection unit 220 regulates the overdrive voltage ODV to be higher or lower than the specific reference voltage VSR, so as to enhance the driving capability of the operational amplifier 235 and to reduce the conversion time of the output voltage VOUT. When the output voltage VOUT is converted to the specific reference voltage VSR, the overdrive voltage ODV is regulated to be equal to the specific reference voltage VSR, such that the output voltage VOUT maintains the reference voltage value corresponding to the input digital signal DAS.

Figure 3:
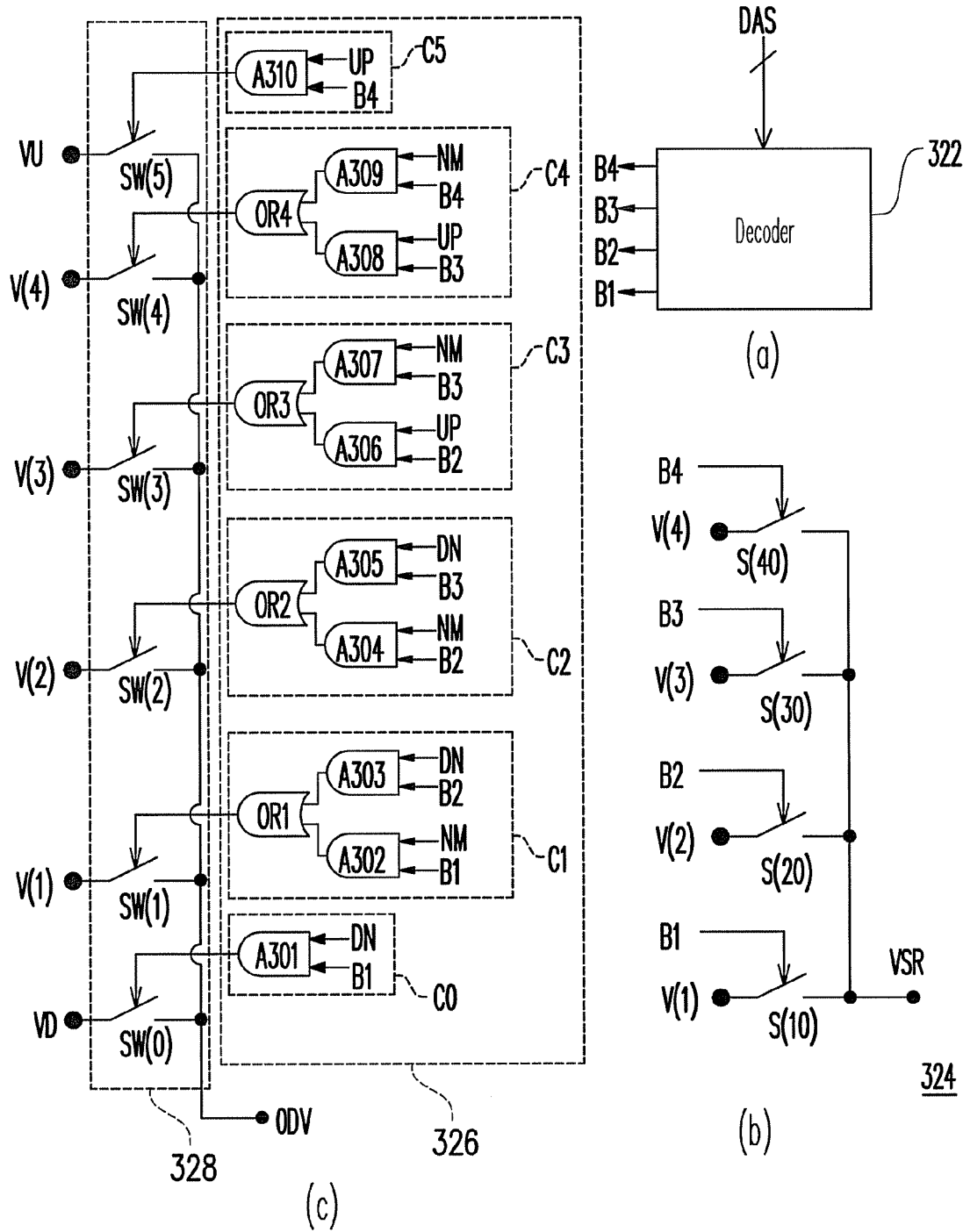
FIG. 3 is a circuit diagram of the selection unit according to an embodiment of the present invention.

The circuit architecture of the selection unit 220 will be further illustrated below. FIG. 3 is a circuit diagram of the selection unit according to an embodiment of the present invention. In this embodiment, the selection unit mainly includes three parts, namely, a decoder 322 as shown in FIG. 3(a), a specific switch circuit 324 as shown in FIG. 3(b), and a logic unit 326 and a selection switch circuit 328 as shown in FIG. 3(c). In the embodiment of FIG. 3, the 2-bit input digital signal DAS i.e., M=2 is taken as the example to illustrate the technical means of this embodiment.

Referring to FIG. 3(a), the decoder 322 receives the input digital signal DAS, and outputs bit signals B1-B4 according to the value of the input digital signal DAS. The corresponding relationship between the enabled states of the bit signals B1-B4 and the input digital signal DAS is shown in Table 1 below.

TABLE 1

|  | DAS | | | |
| --- | --- | --- | --- | --- |
|  | 00 | 01 | 10 | 11 |
| Enabled | B1 | B2 | B3 | B4 |

Figure 1:
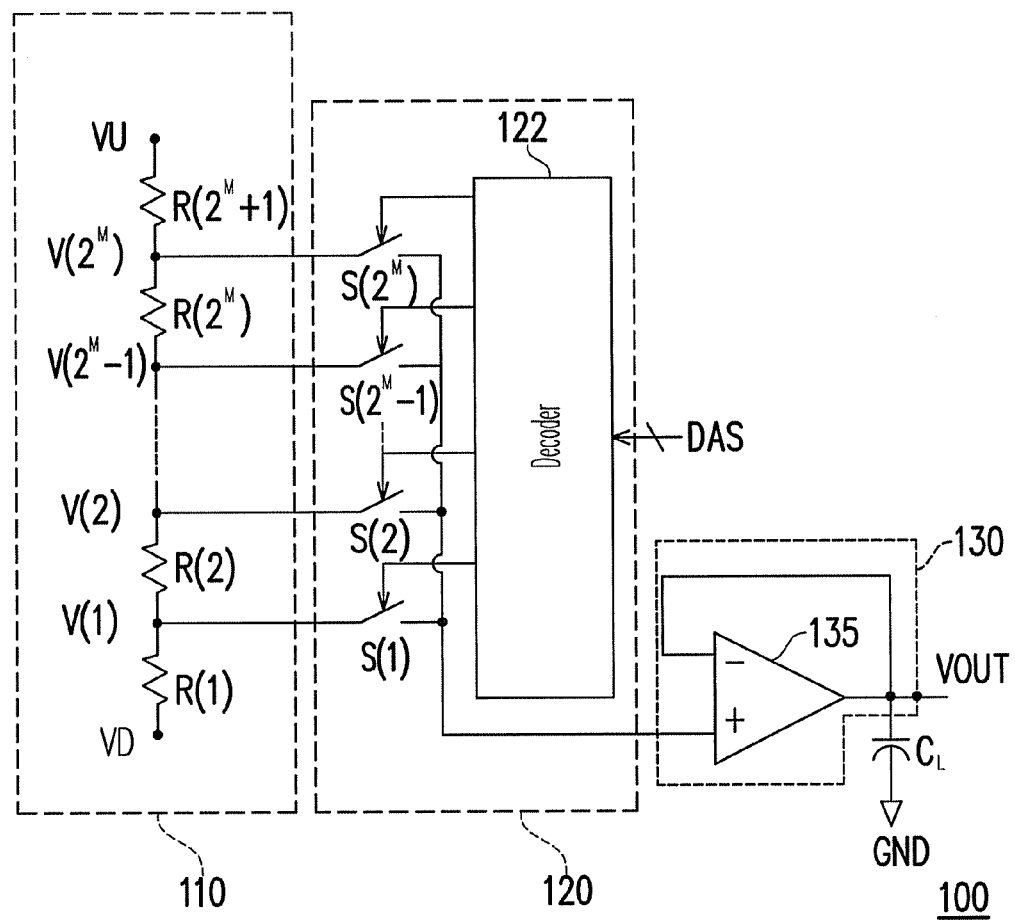
FIG. 1 is a DAC according to the conventional art.

Referring to FIG. 1, the decoder 322 correspondingly enables one of the bit signals B1-B4 according to the value of the input digital signal DAS. The specific switch circuit 324 outputs the specific reference voltage VSR corresponding to the input digital signal DAS according to the bit signals B1-B4. Referring to FIG. 3(b), the specific switch circuit 324 includes specific switches S(10)-S(40) coupled between the decoder 322 and the reference voltages V(1)-V(4), and turns on one of the specific switches S(10)-S(40) according to the bit signals B1-B4 to output the specific reference voltage VSR. For example, when the digital signal DAS is 00, the bit signal B1 is enabled, and the specific switch S(10) is turned on. At this time, the specific reference voltage VSR equals to the reference voltage V(1). Other situations are similar to the above description, and will not be described herein again.

The overdrive voltage ODV is controlled by the logic unit 326 and the selection switch circuit 328. Referring to FIG. 3(c), the selection switch circuit 328 is constituted of selection switches SW(0)-SW(5). One end of the selection switches SW(0)-SW(5) are coupled to the upper limit voltage VU, the reference voltages V(1)-V(4), and the lower limit voltage VD respectively, and the other end of the selection switches SW(0)-SW(5) are coupled to the output terminal of the selection unit 220, so as to output the overdrive voltage ODV. The logic unit 326 controls the ON/OFF states of the selection switches SW(0)-SW(5) according to the bit signals B1-B4, the voltage-up signal UP, the restoring signal NM, and the voltage-down signal DN. For one time, the logic unit 326 turns on one of the selection switches SW(0)-SW(5) only.

The logic unit 326 includes control units C0-C5 which control the selection switches SW(0)-SW(5) respectively. The selection switch SW(0) is turned on only when the input digital signal DAS is 00, and the output voltage VOUT is higher than the specific reference voltage VSR (at this time, the specific reference voltage VSR equals to the reference voltage V(1)), i.e., when the voltage-down signal DN is enabled. Therefore, the selection unit C0 can be constituted of a AND gate A301. An output terminal of the AND gate A301 is coupled to the selection switch SW(0), so as to control the selection switch SW(0) according to the voltage-down signal DN and the bit signal B1.

The selection switch SW(1) is turned on when the input digital signal DAS is 00 and the restoring signal NM is enabled, or when the input digital signal DAS is 01 and the voltage-down signal DN is enabled. Therefore, the control unit C1 can be constituted of AND gates A302, A303, and an OR gate OR1. The input terminals of the AND gate A302 are coupled to the bit signal B1 and the restoring signal NM, and the input terminals of the AND gate A303 are coupled to the bit signal B2 and the voltage-down signal DN. The OR gate OR1 controls the selection switch SW(1) according to the outputs of the AND gates A302, A303.

The selection switch SW(2) is turned on when the input digital signal DAS is 01 and the restoring signal NM is enabled, or when the input digital signal DAS is 10 and the voltage-down signal DN is enabled. Therefore, the control unit C2 can be constituted of AND gates A304, A305, and an OR gate OR2. The input terminals of the AND gate A304 are coupled to the bit signal B2 and the restoring signal NM, and the input terminals of the AND gate A305 are coupled to the bit signal B3 and the voltage-down signal DN. The OR gate OR2 controls the selection switch SW(2) according to the outputs of the AND gates A304, A305.

The selection switch SW(3) is turned on when the input digital signal DAS is 10 and the restoring signal NM is enabled, or when the input digital signal DAS is 01 and the voltage-up signal UP is enabled. Therefore, the control unit C3 can be constituted of AND gates A306, A307, and an OR gate OR3. The input terminals of the AND gate A306 are coupled to the bit signal B2 and the voltage-up signal UP, and the input terminals of the AND gate A307 are coupled to the bit signal B3 and the restoring signal NM. The OR gate OR3 controls the selection switch SW(3) according to the outputs of the AND gates A306, A307.

The selection switch SW(4) is turned on when the input digital signal DAS is 11 and the restoring signal NM is enabled, and when the input digital signal DAS is 10 and the voltage-up signal UP is enabled. Therefore, the control unit C4 can be constituted of AND gates A308, A309, and an OR gate OR4. The input terminals of the AND gate A308 are coupled to the bit signal B3 and the voltage-up signal UP, and the input terminals of the AND gate A309 are coupled to the bit signal B4 and the restoring signal NM. The OR gate OR4 controls the selection switch SW(4) according to the outputs of the AND gates A308, A309.

The selection switch SW(5) is turned on only when the input digital signal DAS is 11 and the output voltage VOUT is lower than the specific reference voltage VSR (at this time, the specific reference voltage VSR equals to the reference voltage V(4)), i.e., when the voltage-up signal UP is enabled. Therefore, the selection unit C5 can be constituted of a AND gate A310. An output terminal of the AND gate A310 is coupled to the selection switch SW(5), so as to control the selection switch SW(5) according to the voltage-up signal UP and the bit signal B4.

The conduction condition of each of the selection switches SW(0)-SW(5), i.e., the condition to regulate the overdrive voltage ODV, has been thus described. Under various circumstances, the control units C0-C5 can selectively turn on one of the selection switches SW(0)-SW(5) according to the conduction conditions of the selection switches SW(0)-SW(5), so as to determine the voltage value of the overdrive voltage ODV. Therefore, the circuit architectures of the control units C0-C5 are not limited to this embodiment. Persons of ordinary skill in the art can easily derive other feasible circuit architectures from the disclosure of the present invention, and the description of such architectures will not be illustrated herein again.

The selection unit of FIG. 3 is also applicable to the M-bit input digital signal DAS, where M is a positive integer, as long as the circuit architecture of the selection unit 220 is regulated correspondingly. When the input digital signal DAS is M-bit, the number of the bit signals output from the decoder 322 is $2^M$, and the number of the specific switch circuits 324 is corresponding to the number of the bit signals. The number of the switches in the selection switch circuit 328 is N, where N=($2^M$+2). The $1^{st}$ selection switch is coupled between the lower limit voltage VD and the output terminal of the selection unit 220, the $2^{nd}$-$(N-1)^{th}$ selection switches are coupled between the reference voltages V(1)-V($2^M$) and the output terminal of the selection unit 220 correspondingly, and the $N^{th}$ selection switch is coupled between the upper limit voltage VU and the output terminal of the selection unit 220. The logic unit 326 includes N control units for controlling the N selection switches.

The $1^{st}$ control unit includes an AND gate for controlling the $1^{st}$ selection switch according to the voltage-down signal DN and the $1^{st}$ bit signal. The $2^{nd}$ control unit includes two AND gates, one of the AND gates receives the voltage-down signal DN and the $2^{nd}$ bit signal, and the other receives the restoring signal NM and the $1^{st}$ bit signal. And an OR gate controls the $2^{nd}$ selection switch according to the outputs of the two AND gates. The $3^{rd}$ control unit includes two AND gates, one of the AND gates receives the voltage-down signal DN and the $3^{rd}$ bit signal, and the other receives the restoring signal NM and the $2^{nd}$ bit signal. And an OR gate controls the 3$^{rd}$ selection switch according to the outputs of the two AND gates. The j$^{th}$ control unit includes a first AND gate, a second AND gate, a third AND gate, and an OR gate, where j is a positive integer, and 4≦j≦(N−3). The first AND gate receives the voltage-down signal DN and the j$^{th}$ bit signal. The second AND gate receives the restoring signal NM and the (j−1)$^{th}$ bit signal. The third AND gate receives the voltage-up signal UP and the (J−2)$^{th}$ bit signal. The OR gate controls the j$^{th}$ selection switch according to the outputs of the first AND gate, the second AND gate, and the third AND gate.

The N$^{th}$ control unit includes an AND gate for receiving the voltage-up signal UP and the (N−2)$^{th}$ bit signal, so as to control the N$^{th}$ selection switch. The (N−1)$^{th}$ control unit includes two AND gates, one of the AND gates receives the voltage-up signal UP and the (N−3)$^{th}$ bit signal, and the other receives the restoring signal NM and the (N−2)$^{th}$ bit signal. And an OR gate controls the (N−1)$^{th}$ selection switch according to the outputs of the two AND gates. The (N−2)$^{th}$ control unit includes two AND gates, one of the AND gates receives the voltage-up signal UP and the (N−4)$^{th}$ bit signal, and the other receives the restoring signal NM and the (N−3)$^{th}$ bit signal. And an OR gate controls the (N−2)$^{th}$ selection switch according to the outputs of the two AND gates.

The above description has illustrated the main technical means of the embodiment of FIG. 3 applied to the M-bit input digital signal DAS in detail. Persons of ordinary skill in the art can easily derive other details of the implementation from the disclosure of the present invention, and the description of such details will not be illustrated herein again.

Figure 4:
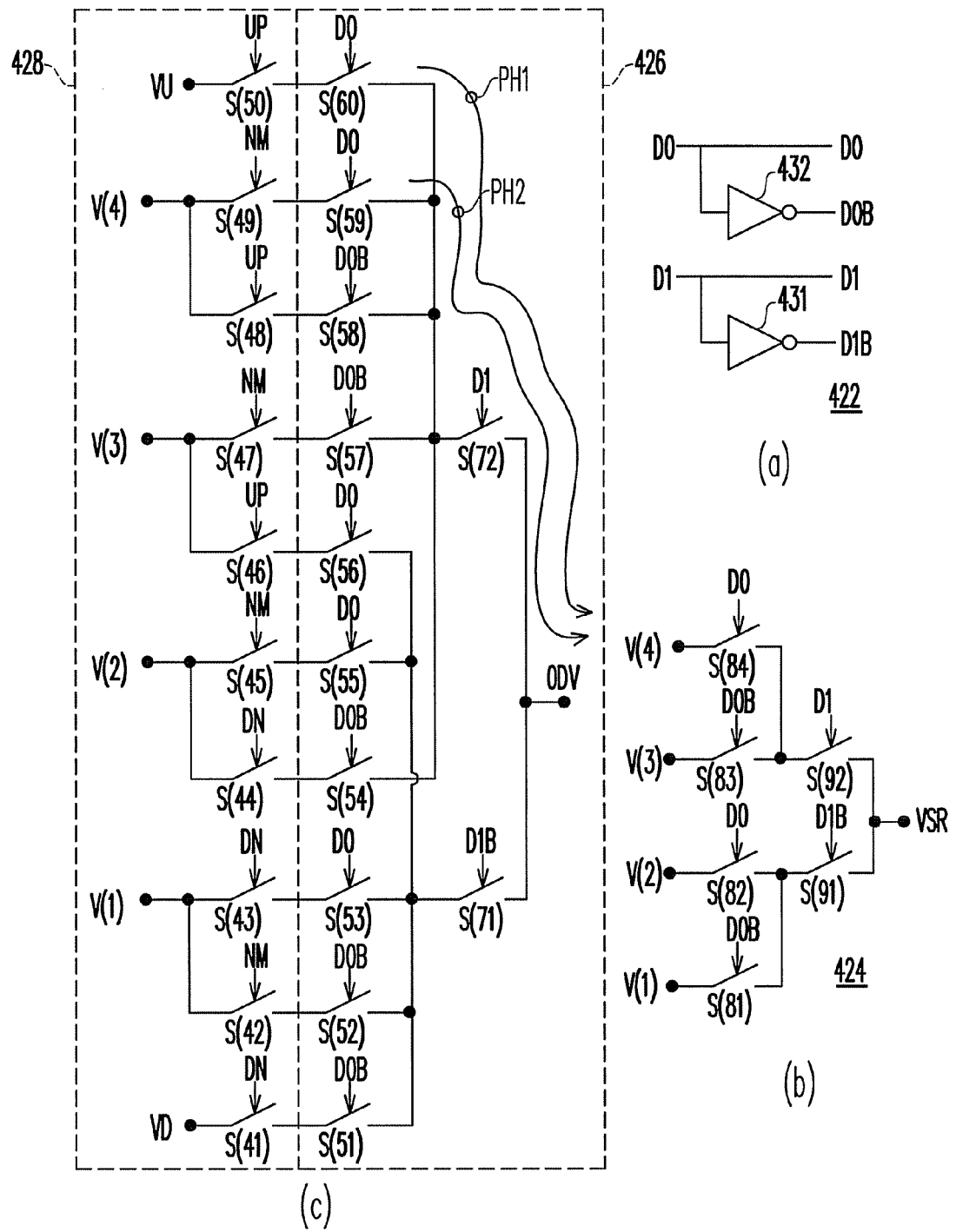
FIG. 4 is a circuit diagram of the selection unit according to another embodiment of the present invention.

FIG. 4 is a circuit diagram of the selection unit according to another embodiment of the present invention. In the embodiment of FIG. 4, the selection unit applicable to the 2-bit input digital signal DAS is taken as the example to illustrate the main technical means of this embodiment. In this embodiment, the input digital signal DAS is D1D0, wherein D0 represents the logic state of the lower bit, and D1 represents the logic state of the higher bit. The voltage divider unit of this embodiment will divide the upper limit voltage VU and the lower limit voltage VD into the reference voltages V(1)-V(4). The selection unit of FIG. 4 mainly includes three parts of circuits, namely, a signal conversion circuit 422 as shown in FIG. 4(a), a specific selection unit 424 as shown in FIG. 4(b), and a bit switch group 426 and a regulation switch group 428 as shown in FIG. 4(c).

Referring to FIGS. 4(a) and 4(b), the signal conversion circuit 422 uses inverters 431, 432 to form signals D0B, D1B. Therefore, the 2-bit input digital signal DAS can generate signals D0, D1, D0B, and D1B, so as to control the specific selection unit 424. The specific selection unit 424 includes switches S(81)-S(84) and switches S(91), S(92). The specific selection unit 424 is coupled between the reference voltages V(2)-V(2) and the detection unit, and selects a conduction path according to the input digital signal DAS, so as to output the specific reference voltage VSR. The ON/OFF state of the switches S(81)-S(84) is determined according to the signals D0, D0B, and the ON/OFF state of the switches S(91)-S(92) is determined according to the signals D1, D1B. As shown in FIG. 4(b), different input digital signals DASs turn on different switches correspondingly. For example, when D0D1=11, the switches S(84), S(92) are turned on, and the specific reference voltage VSR equals to the reference voltage V(4). Therefore, when the input digital signal DAS changes, the specific reference voltage VSR will change accordingly.

The bit switch group 426 includes bit switches S(51)-S(60) and bit switches S(71)-S(72). The bit switch group 426 is coupled to the regulation switch group 428, and selectively turns on the bit switches according to the input digital signal DAS, so as to regulate the overdrive voltage ODV. The bit switches S(51)-S(60) are selectively turned on according to the signals D0, D0B, and the bit switches S(71)-S(72) are selectively turned on according to the signals D1, D1B. Therefore, different input digital signals DAS correspond to different conduction paths. As the overdrive voltage ODV is influenced by the regulation signal RGS, each input digital signal DAS is corresponding to more than one path. For example, when D0D1=11, conduction paths PH1 and PH2 are formed. The reason of the above situation is that when the input digital signal DAS=11, one of the voltage-up signal UP and the restoring signal NM of the regulation signal RGS is enabled. In other words, whether PH1 or PH2 is selected to be the conduction path is determined according to whether the output voltage VOUT is lower than the reference voltage V(4) or equals to the reference voltage V(4) (when the input digital signal DAS is 11, the specific reference voltage equals to the reference voltage V(4)). Similarly, different input digital signals DAS correspond to different possible conduction paths.

Next, the regulation switch group 428 includes regulation switches S(41)-S(50). The regulation switch group 428 is coupled to the voltage divider unit, and selectively turns on the regulation switches S(41)-S(50) according to the regulation signal RGS. According to the control signals, the regulation signals S(41)-S(50) are divided into three types, namely, voltage-up switches, voltage-down switches, and response switches. The voltage-up switches include the regulation switches S(46), S(48), S(50), the voltage-down switches include the regulation switches S(41), S(43), S(44), and the response switches include the regulation switches S(42), S(45), S(47), S(49). The three types of regulation switches are controlled by the voltage-up signal UP, the voltage-down signal DN, and the restoring signal NM respectively. For example, when the voltage-up signal UP is enabled, the regulation switches S(46), S(48), S(50) are turned on. Therefore, the regulation switch group 428 and the bit switch group 426 form a conduction path according to the regulation signal RGS and the input digital signal DAS, so as to regulate the overdrive voltage ODV.

For example, when the input digital signal DAS is 11, and the output voltage VOUT is lower than the reference voltage V(4) (when the input digital signal DAS is 11, the specific reference voltage VSR equals to the reference voltage V(4)), the switch S(50) is turned on, and the conduction path PH1 is used, such that the overdrive voltage ODV equals to the upper limit voltage VU. If the output voltage VOUT equals to the reference voltage V(4), the switch S(49) is turned on, and the path PH2 is used, such that the overdrive voltage ODV equals to the reference voltage V(4). Other situations are similar to the above description, and will not be described herein again. Moreover, the embodiment of FIG. 4 is also applicable to the input digital signal of other bits. Persons of ordinary skill in the art can easily derive such applications from the disclosure of the present invention, and the description of such applications will not be illustrated herein again.

Based on the description of the embodiment of FIGS. 3 and 4, the selection unit is mainly used to output the corresponding specific voltage VSR according to the input digital signal DAS, and regulates the overdrive voltage ODV according to the input digital signal DAS and the regulation signal RGS. If the output voltage VOUT is lower than the expected voltage value, i.e., the specific reference voltage VSR, the overdrive voltage ODV is regulated to be higher (in this embodiment, the overdrive voltage ODV is regulated to the reference voltage a bit higher than the input digital signal DAS). If the output voltage VOUT is higher than the expected voltage value, i.e., the specific reference voltage VSR, the overdrive voltage ODV is regulated to be lower (in this embodiment, the overdrive voltage ODV is regulated to the reference voltage a bit lower than the input digital signal DAS). If the output voltage VOUT equals to the expected voltage value, i.e., the specific reference voltage VSR, the overdrive voltage ODV is made to be equal to the reference voltage corresponding to the input digital signal DAS. In another embodiment of the present invention, the regulation of the overdrive voltage ODV is not limited to one bit. The regulation amplitude can be set to be larger according to the design requirements.

The embodiments of FIGS. 3 and 4 are only embodiments of the present invention, and are not used to limit the implementations of the present invention. Persons of ordinary skill in the art can easily derive other feasible implementations from the disclosure of the present invention, and the description of such implementations will not be illustrated herein again.

Figure 5:
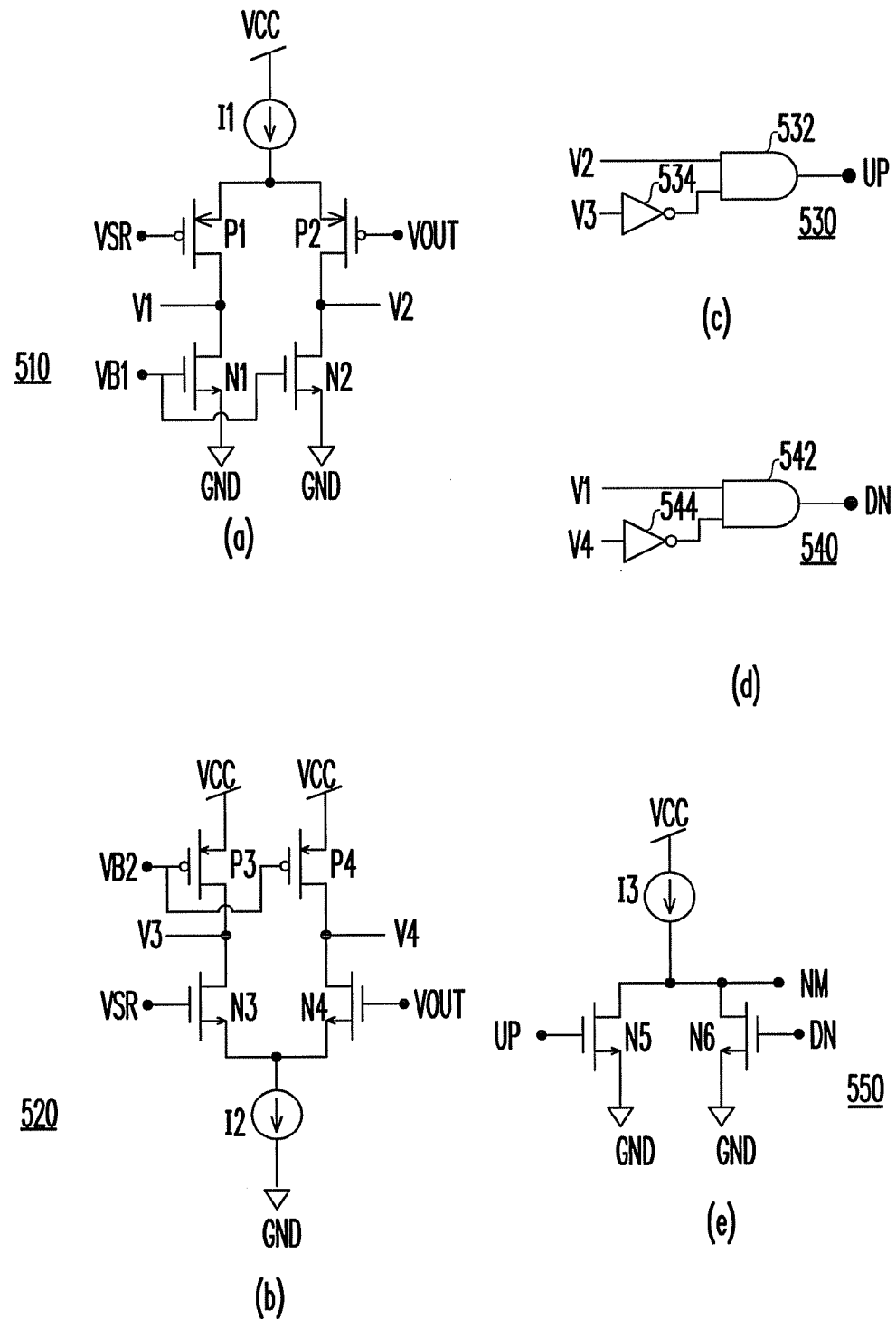
FIG. 5 is a circuit diagram of the detection unit according to another embodiment of the present invention.

FIG. 5 is a circuit diagram of the detection unit according to another embodiment of the present invention. Referring to FIGS. 2A and 5 together, the detection unit 240 is mainly used to compare the specific reference voltage VSR and the output voltage VOUT and to output the regulation signal RGS to the selection unit 220 according to the comparison result. In the embodiment of FIG. 5, the circuit of the detection unit 240 mainly includes five parts, namely, a first detection circuit 510 as shown in FIG. 5(a), a second detection circuit 520 as shown in FIG. 5(b), a voltage-up circuit 530 as shown in FIG. 5(c), a voltage-down circuit 540 as shown in FIG. 5(d), and a restoring circuit as shown in FIG. 5(e).

Referring to FIG. 5(a), the first detection unit 510 includes a current source I1, PMOS transistors P1, P2, and NMOS transistors N1, N2. A source of the PMOS transistor P1 is coupled to the current source I1, and a gate of P1 is coupled to the specific reference voltage VSR. A source of the PMOS transistor P2 is coupled to the current source I1, and a gate of P2 is coupled to the output voltage VOUT. The NMOS transistor N1 is coupled between a drain of the PMOS transistor P1 and the ground terminal GND. The NMOS transistor N2 is coupled between a drain of the PMOS transistor P2 and the ground terminal GND, and the gates of the NMOS transistor N2 and the NMOS transistor N1 are both coupled to a DC bias VB1. A common node of the PMOS transistor P1 and the NMOS transistor N1 outputs a first detection voltage V1, and a common node of the PMOS transistor P2 and the NMOS transistor N2 outputs a second detection voltage V2.

When the specific reference voltage VSR is higher than the output voltage VOUT, the first detection voltage V1 is output as a low level, and the second detection voltage V2 is output as a high level. When the specific reference voltage VSR is lower than the output voltage VOUT, the first detection voltage V1 is output as a high level, and the second detection voltage V2 is output as a low level. When the specific reference voltage VSR equals to the output voltage VOUT, the first detection voltage V1 and the second detection voltage V2 are both output as a low level.

Referring to FIG. 5(b), the second detection unit 520 includes a current source I2, PMOS transistors P3, P4, and NMOS transistors N3, N4. A source of the PMOS transistor P3 is coupled to a working voltage VCC, a source of the PMOS transistor P4 is coupled to the working voltage VCC, and gates of the PMOS transistor P3 and the PMOS transistor P4 are both coupled to a DC bias VB2. The NMOS transistor N3 is coupled between the PMOS transistor P3 and the current source I2, and a gate of the NMOS transistor N3 is coupled to the specific reference voltage VSR. The NMOS transistor N4 is coupled between the PMOS transistor P4 and the current source I2, and a gate of the NMOS transistor N4 is coupled to the output voltage VOUT. A common node of the PMOS transistor P3 and the NMOS transistor N3 outputs a third detection voltage V3, and a common node of the PMOS transistor P4 and the NMOS transistor N4 outputs a fourth detection voltage V4.

When the specific reference voltage VSR is higher than the output voltage VOUT, the third detection voltage V3 is output as a low level, and the fourth detection voltage V4 is output as a high level. When the specific reference voltage VSR is lower than the output voltage VOUT, the third detection voltage V3 is output as a high level, and the fourth detection voltage V4 is output as a low level. When the specific reference voltage VSR equals to the output voltage VOUT, the third detection voltage V3 and the fourth detection voltage V4 are both output as a high level.

Referring to FIGS. 5(c), 5(d), and 5(e), the voltage-up circuit 530 includes an inverter 534 and an AND gate 532. The third detection voltage V3 is coupled to an input terminal of the AND gate 532 via the inverter 534. The AND gate 532 outputs the voltage-up signal UP according to the inverted third detection voltage V3 and second detection voltage V2. The voltage-down circuit 540 includes an inverter 544 and an AND gate 542. The AND gate 542 outputs the voltage-down signal DN according to the inverted fourth detection voltage V4 and first detection voltage V1. The restoring circuit 550 includes a current source I3, and NMOS transistors N5, N6. The NMOS transistor N5 and the NMOS transistor N6 are coupled in parallel between the current source I3 and the ground terminal GND. A common node of the NMOS transistors N5, N6 and the current source I3 outputs the restoring signal NM.

The voltage-down signal DN, the voltage-up signal UP, and the restoring signal NM of the regulation signal RGS are obtained according to the comparison result between the reference voltage VSR and the output voltage VOUT. Therefore, in order to illustrate the corresponding relationship of the aforementioned signals, the relative changes of the above signals are listed in the table below, in which logic 1 represents being enabled, and logic 0 represents being disabled.

TABLE 2

|  | V1 | V2 | V3 | V4 | UP | DN | NM |
|---|---|---|---|---|---|---|---|
| VSR > VOUT | 0 | 1 | 0 | 1 | 1 | 0 | 0 |
| VSR < VOUT | 1 | 0 | 1 | 0 | 0 | 1 | 0 |
| VSR = VOUT | 0 | 0 | 1 | 1 | 0 | 0 | 1 |

As shown in FIG. 2, the detection unit 240 outputs the voltage-up signal UP, the voltage-down signal DN, and the restoring signal NM of the regulation signal RGS correspondingly according to the relationship between the specific reference voltage VSR and the output voltage VOUT.

Figure 6:
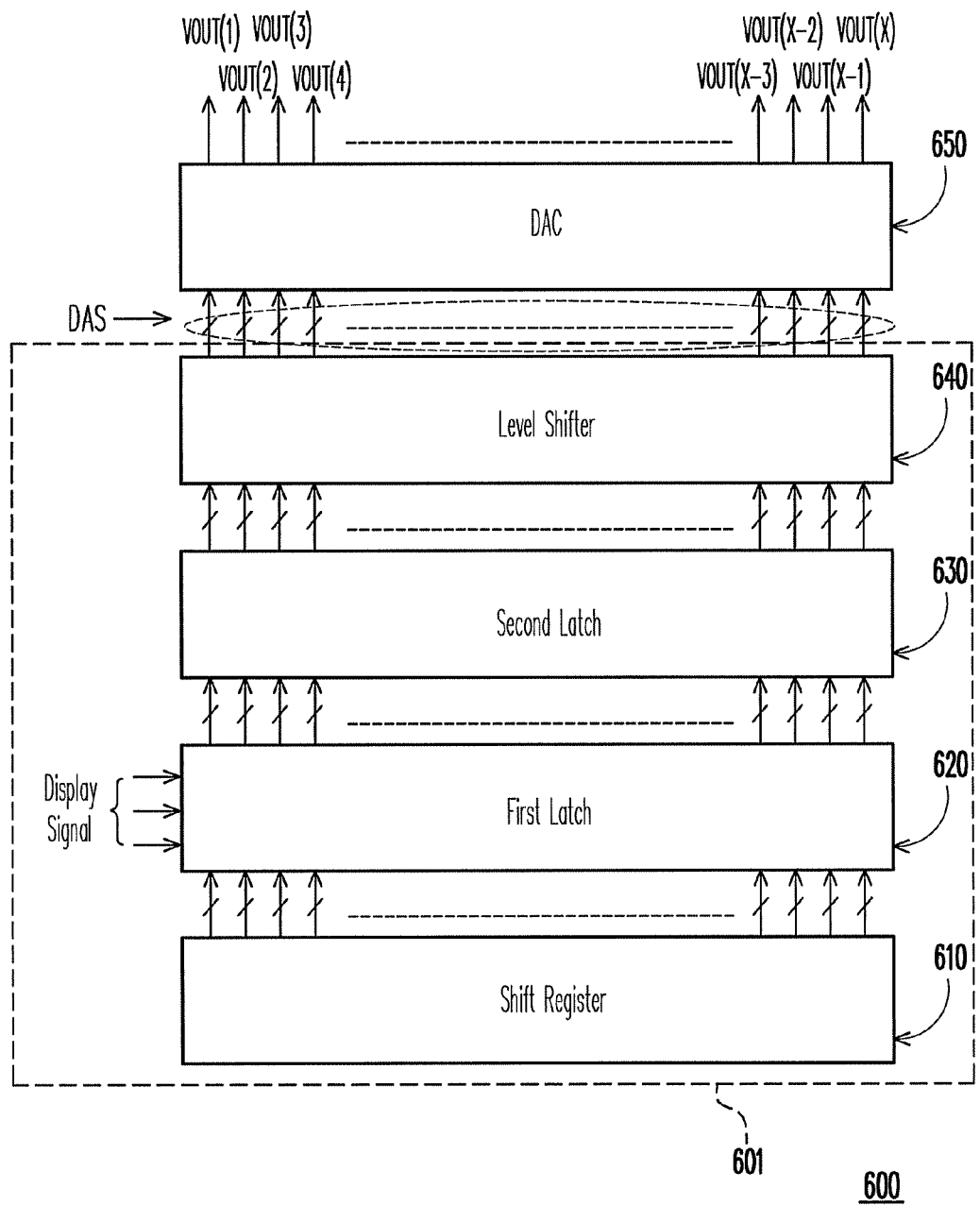
FIG. 6 is a block diagram of a source driver according to another embodiment of the present invention.

In another embodiment of the present invention, the DAC of this embodiment is applicable to source drivers of a LCD. FIG. 6 is a block diagram of a source driver according to another embodiment of the present invention. The source driver 600 includes a driving unit 601 and a DAC 650. The driving unit 601 outputs a plurality of input digital signals DAS according to the input display signal, and the DAC 650 is coupled to the driving unit 601, so as to generate a plurality of output voltages VOUT(1)-VOUT(X) according to the input digital signals DAS. As the source driver 600 needs to drive a plurality of data lines at the same time, the DAC 650 is required to output a plurality of output voltages VOUT(1)-VOUT(X) at the same time, where X is a positive integer.

In this embodiment, the input digital signals DAS is corresponding to a plurality of reference voltages, and the DAC 650 compares the output voltages VOUT(1)-VOUT(X) and the corresponding plurality of reference voltages according to the input digital signals DAS. If the output voltages VOUT(1)-VOUT(X) are not equal to the corresponding reference voltages corresponding to the input digital signal DAS, the DAC regulates the reference voltages corresponding to the input digital signal DAS in real time, such that the output voltages VOUT(1)-VOUT(X) reach the reference voltages corresponding to the input digital signal DAS quickly.

The driving unit 601 includes a shift register 610, a first latch 620, a second latch 630, and a level shifter 640. The shift register 610 is used to generate a shift signal, the first latch 620 receives and latches a display signal according to the display signal and the shift signal. The second latch 630 is coupled to the first latch 620, so as to latch the signal output from the first latch 620. Then, the level shifter 640 is coupled to the second latch 630, and receives and regulates the output of the second latch 630, so as to output the digital signal DAS. In the embodiment of FIG. 6, the digital signals DAS can comprise a plurality of digital signals in parallel, in which a digital signal is corresponding to one of the output signal VOUT(1)-VOUT(X). The DAC 200 of the present invention can be applied to the source driver 600, as long as the number of the DACs 200 in the source driver 600 is the same as the output voltages VOUT(1)-VOUT(X) required to be output (all the DACs 200 can share one voltage divider unit 210). By utilizing the DACs of the present invention, the slew rate of the source driver 600 can be improved, and the conversion speed of the source driver 600 can be increased. Thus, the display quality of the LCD is improved.

Figure 7:
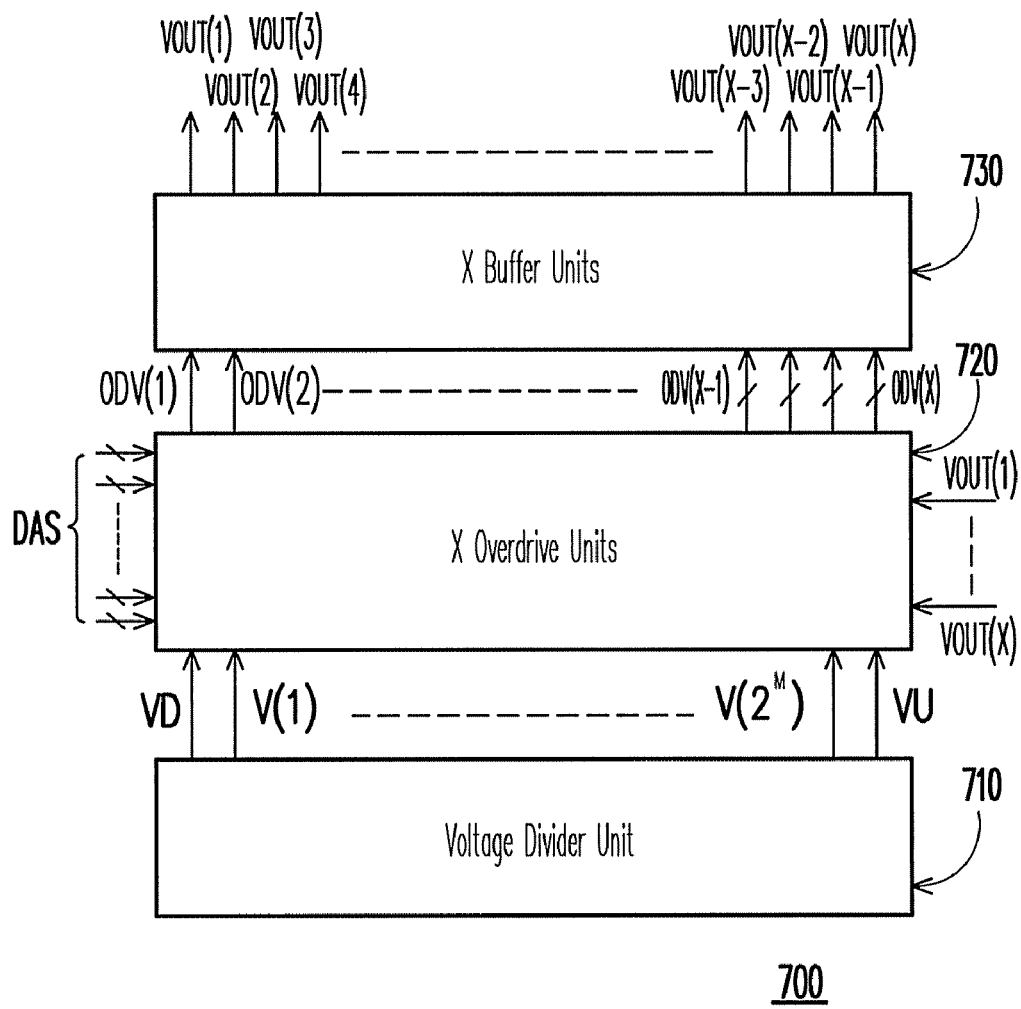
FIG. 7 shows a DAC according to another embodiment of the present invention.

Next, the main circuit architecture of the DAC 650 is illustrated according to the embodiment of FIG. 7. FIG. 7 shows a DAC according to another embodiment of the present invention. The embodiment of FIG. 7 is applicable to an M-bit source driver capable of driving X data lines, where X is a positive integer. The DAC 700 includes a voltage divider unit 710, X overdrive units 720, and X buffer units 730. In the embodiment of FIG. 7, a voltage divider unit 710 provides reference voltages required by the X overdrive units 720, thereby simplifying the circuit architecture of the DAC in the source driver. The voltage divider unit 710 is used to provide an upper limit voltage VU, a lower limit voltage VD, and reference voltages V(1)-V($2^M$) between the upper limit voltage VU and the lower limit voltage VD. The circuit architecture of the voltage divider unit 710 is shown in the embodiment of FIG. 2B.

The X buffer units 730 correspond to the X overdrive units 720, and generate output voltages VOUT(1)-VOUT(X) according to overdrive voltages ODV(1)-ODV(X) output from the X overdrive units 720. The buffer units are in one-to-one correspondence with the overdrive voltages. Moreover, the X overdrive units 720 are coupled to the voltage divider unit 710, and compare the output voltage VOUT(1)-VOUT(X) and the corresponding reference voltages V(1)-V($2^M$) according to the input digital signals DAS, so as to regulate the overdrive voltages ODV(1)-ODV(X), such that the output voltages VOUT(1)-VOUT(X) reach the reference voltages corresponding to the input digital signals DAS more quickly.

Taking one overdrive unit as an example, each of the overdrive units includes a selection unit and a detection unit. The selection unit is coupled to the voltage divider unit 710, and the selection unit has a first output terminal and a second output terminal. The first output terminal is used to output a specific overdrive voltage among the overdrive voltages ODV(1)-ODV(X), and the second output terminal is used to output a specific reference voltage corresponding to the input digital signals DAS from among the reference voltages V(1)-V($2^M$). The detection unit is coupled to the selection unit and the buffer unit, and the detection unit compares the corresponding specific output voltage among the output voltages VOUT(1)-VOUT(X) and the corresponding specific reference voltage, and outputs a regulation signal to the selection unit. The selection unit regulates the corresponding specific overdrive voltage according to the regulation signal and the input digital signal, such that the corresponding specific output voltage reaches the reference voltage corresponding to the input digital signal more quickly. In other words, one overdrive unit is matched with one buffer unit to determine the voltage value of one output voltage.

The circuit architectures and details in operation of a single overdrive unit and buffer unit are as shown in the illustration of FIGS. 2A-5. Persons of ordinary skill in the art can easily derive such architectures and details from the disclosure of the present invention, and the description of such architectures and details will not be illustrated herein again.

Figure 8:
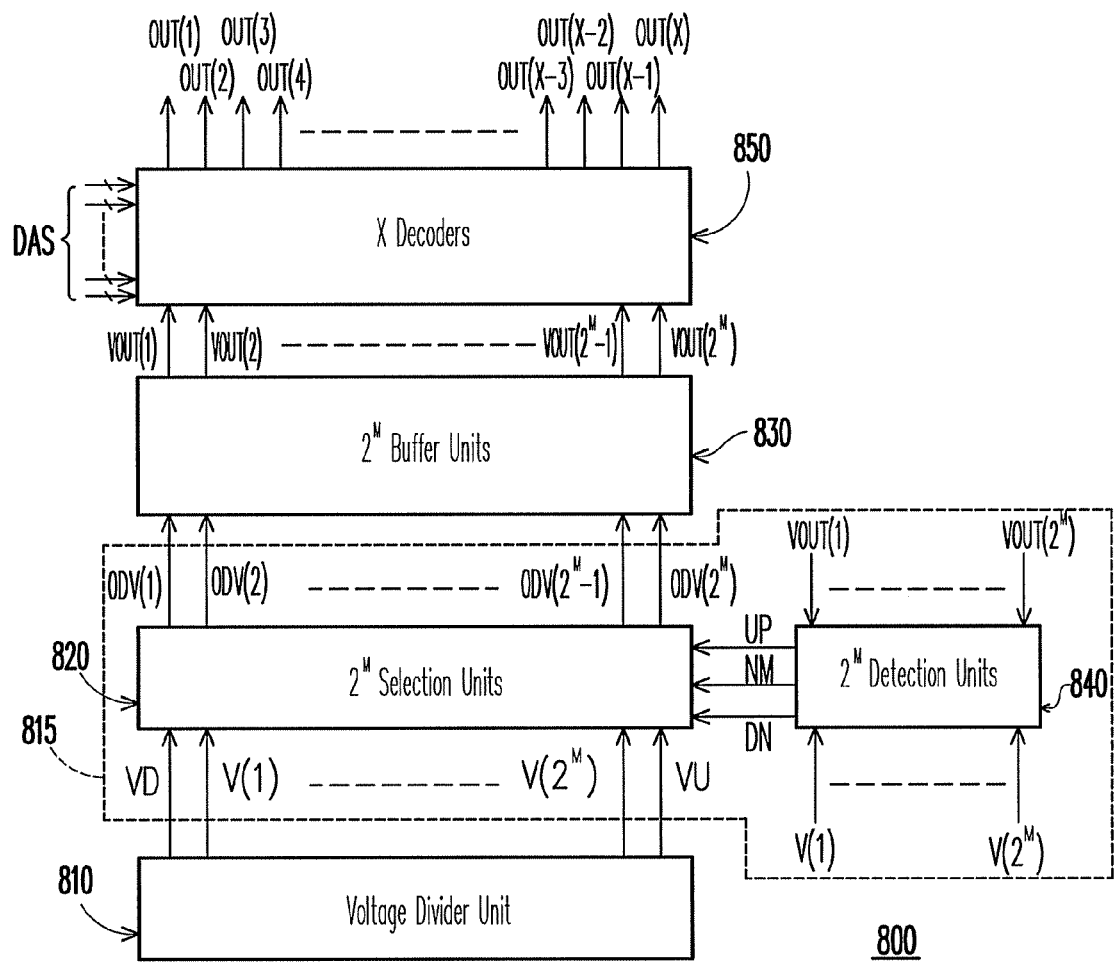
FIG. 8 shows a DAC according to another embodiment of the present invention.

FIG. 8 shows a DAC according to another embodiment of the present invention. The DAC of FIG. 8 is applicable to an M-bit source driver capable of driving X data lines. The DAC 800 includes a voltage divider unit 810, an overdrive unit 815, $2^M$ buffer units 830, and X decoders 850. The overdrive unit 815 includes $2^M$ selection units 820 and $2^M$ detection units 840. The main difference between the embodiments of FIG. 8 and FIG. 7 is the X decoders 850. The X decoders 850 select corresponding voltages from first output voltages VOUT(1)-VOUT($2^M$) output from the $2^M$ buffer units 830, so as to generate second output voltages OUT(1)-OUT(X). The $2^M$ detection units 840 compare the first output voltages VOUT(1)-VOUT($2^M$) and the corresponding reference voltages V(1)-V($2^M$), and output the regulation signal RGS to the $2^M$ selection units 820 accordingly. The DAC 800 of FIG. 8 can be applied as the DAC 650 of the source driver 600, as long as the second output voltages OUT(1)-OUT(X) output from the X decoders 850 replace the output voltages VOUT(1)-VOUT(X) output from the DAC 650.

The detection units, the selection units, and the buffer units are in one-to-one correspondence. As the number of the second output voltages is determined by the output data lines of the source driver, in this embodiment, the X output data lines require X decoders to output the X second output voltages. The number of the buffer units is determined according to the number of bits of the input digital signal. In this embodiment, $2^M$ buffers are required to process the M-bit input digital signal. That is, the DAC of FIG. 8 can reduce the number of the buffers in the source driver (if $2^M$<X). Meanwhile, the DAC 800 of FIG. 8 can also regulate the overdrive voltages ODV(1)-ODV($2^M$) according to the regulation signal RGS, such that the second output voltages OUT(1)-OUT(X) reach the reference voltages corresponding to the input digital signals DAS of each data line more quickly. The detailed circuit architectures and the operating principles of the overdrive unit 815, the voltage divider unit 810, and the buffer units 830 are as shown in the description of FIGS. 2A-7, and the $2^M$ selection units 820 can be realized with reference to the regulation switch group 428 of FIG. 4(c) in an embodiment of the present invention. The regulation signal RGS from the $2^M$ detection units 840 is received to regulate the magnitude of the overdrive voltages ODV(1)-ODV($2^M$). Persons of ordinary skill in the art can easily derive the aforementioned technical schemes from the disclosure of the present invention, and the description of such technical schemes will not be illustrated herein again.

Figure 9:
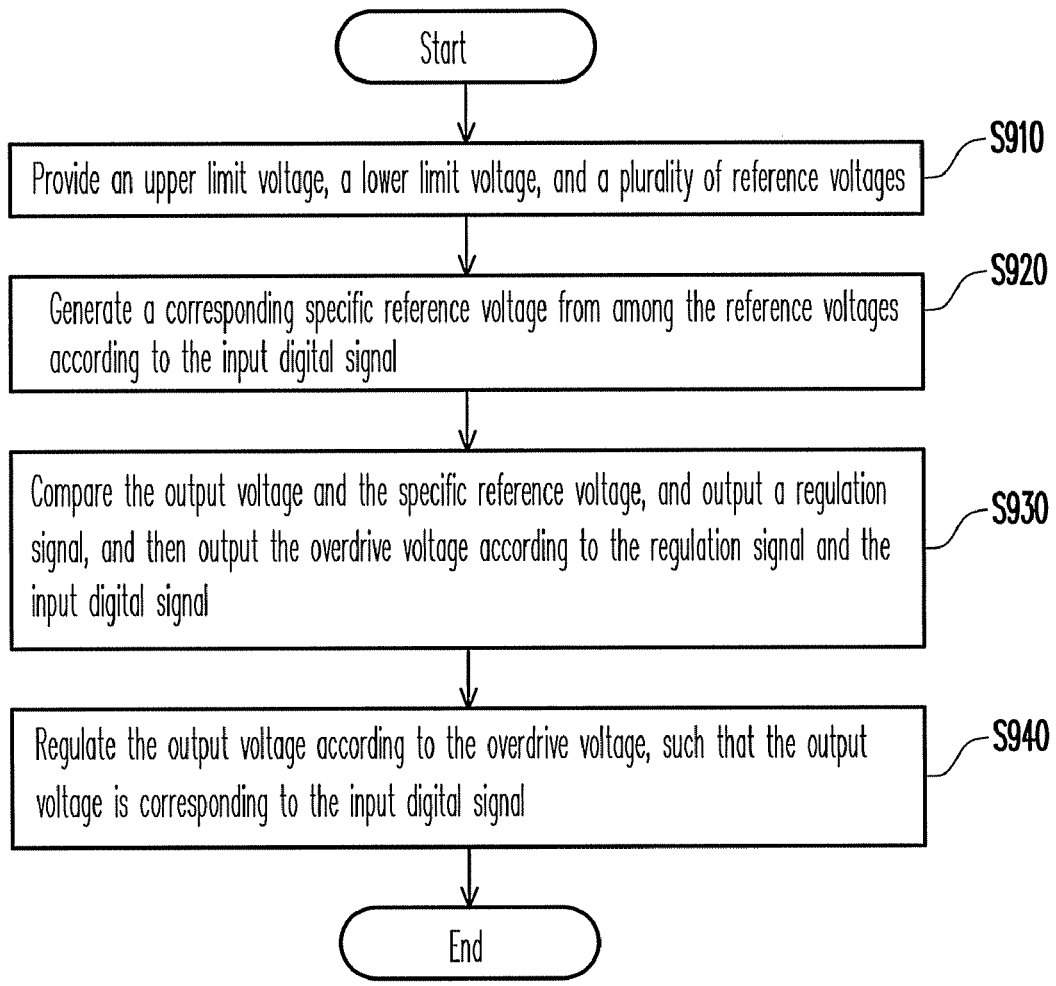
FIG. 9 is a block view of a digital-to-analog conversion method according to another embodiment of the present invention.

The present invention also provides a digital-to-analog conversion method. FIG. 9 is a flow chart of the digital-to-analog conversion method according to another embodiment of the present invention. Referring to FIGS. 2A-8, in Step S910, the upper limit voltage VU, the lower limit voltage VD, and a plurality of reference voltages between the upper limit voltage VU and the lower limit voltage VD are provided. In Step S920, a specific reference voltage VSR is generated according to the input digital signal DAS, and the specific reference voltage VSR is one of the reference voltages. Then, in Step S930, the previous output voltage VOUT is compared with the specific reference voltage VSR to output a regulation signal RGS. Next, the overdrive voltage ODV is regulated according to the input digital signal DAS and the regulation signal RGS. In Step S940, the output voltage VOUT reaches the reference voltage corresponding to the input digital signal DAS more quickly according to the overdrive voltage ODV.

And Step S940 further includes that if the output voltage VOUT is lower than the specific reference voltage VSR, the overdrive voltage is made to be higher than the specific reference voltage VSR. If the output voltage VOUT is higher than the specific reference voltage VSR, the overdrive voltage ODV is made to be lower than the specific reference voltage VSR. And if the output voltage VOUT equals to the specific reference voltage VSR, the overdrive voltage ODV is made to be equal to the specific reference voltage VSR. Other operation details of the aforementioned digital-to-analog conversion method have been described in the above embodiments. With reference to the illustration of FIGS. 2A-8, persons of ordinary skill in the art can easily derive such details from the disclosure of the present invention, and the description of such details will not be illustrated herein again.

The present invention regulates the input voltage of the buffer unit in real time according to the comparison result between the output voltage and the reference voltage corresponding to the input digital signal, so as to improve the slew rate of the buffer unit and the conversion speed of the DAC. Therefore, the present invention can improve the conversion speed of the DAC significantly without increasing the power consumption, and improve the display quality when the source driver drives the large-size LCD panel.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital-to-analog converter (DAC), comprising:
    a voltage divider unit, for providing an upper limit voltage, a lower limit voltage, and a plurality of reference voltages between the upper limit voltage and the lower limit voltage;
    a selection unit, coupled to the voltage divider unit, wherein the selection unit has a first output terminal and a second output terminal, the first output terminal is used to output an overdrive voltage, and the second output terminal is used to output a specific reference voltage corresponding to an input digital signal from among the reference voltages;
    a buffer unit, coupled to the selection unit, for generating an output voltage according to the overdrive voltage; and
    a detection unit, coupled to the selection unit and the buffer unit, for comparing the output voltage and the specific reference voltage, and outputting a regulation signal to the selection unit;
    wherein the selection unit regulates the overdrive voltage according to the regulation signal such that the output voltage is corresponding to the input digital signal.

2. The DAC as claimed in claim 1, wherein if the output voltage is lower than the specific reference voltage, the selection unit makes the overdrive voltage higher than the specific reference voltage; if the output voltage is higher than the specific reference voltage, the selection unit makes the overdrive voltage lower than the specific reference voltage; and if the output voltage equals to the specific reference voltage, the selection unit makes the overdrive voltage equal to the specific reference voltage.

3. The DAC as claimed in claim 1, wherein the regulation signal comprises:
    a voltage-up signal, being enabled when the output voltage is lower than the specific reference voltage;
    a voltage-down signal, being enabled when the output voltage is higher than the specific reference voltage; and
    a restoring signal, being enabled when the output voltage is equal to the specific reference voltage;
    wherein the selection unit makes the overdrive voltage higher than the specific reference voltage when the voltage-up signal is enabled; the selection unit makes the overdrive voltage lower than the specific reference voltage when the voltage-down signal is enabled; and the selection unit makes the overdrive voltage equal to the specific reference voltage when the restoring signal is enabled.

4. The DAC as claimed in claim 1, wherein the voltage divider unit comprises:
    a plurality of resistors, connected in series between the upper limit voltage and the lower limit voltage, wherein voltages divided by the resistors form the reference voltages, and the upper limit voltage is higher than the lower limit voltage.

5. The DAC as claimed in claim 1, wherein the selection unit comprises:
    a decoder, outputting a plurality of bit signals according to the input digital signal, wherein the bit signals correspond to the value of the input digital signal;
    a plurality of specific switches, coupled between the decoder and the reference voltages, wherein one of the specific switches is turned on according to the bit signals to output the specific reference voltage;

a plurality of selection switches, coupled between the voltage divider unit and the first output terminal of the selection unit; and a logic unit, coupled to the selection switches correspondingly, turning on one of the selection switches according to the regulation signal and the bit signals, so as to regulate the overdrive voltage.

6. The DAC as claimed in claim 5, wherein if the input digital signal is M-bit and M is a positive integer, the number of the bit signals is $2^M$, the number of the selection switches is N, and N equals to $(2^M+2)$, wherein the first selection switch is coupled between the lower limit voltage and the first output terminal of the selection unit, the $2^{nd}$-$(N-1)^{th}$ selection switches are coupled between the reference voltages and the first output terminal of the selection unit correspondingly, the $N^{th}$ selection switch is coupled between the upper limit voltage and the first output terminal of the selection unit.

7. The DAC as claimed in claim 6, wherein the logic unit comprises N control units; wherein the $i^{th}$ control unit is used to control the $i^{th}$ selection switch, in which I is a positive integer, and $1 \leq i \leq N$;

wherein the $1^{st}$ control unit comprises:
a first AND gate, controlling the $1^{st}$ selection switch according to a voltage-down signal and the $1^{st}$ bit signal;

the $2^{nd}$ control unit comprises:
a second AND gate, receiving the voltage-down signal and the $2^{nd}$ bit signal;
a third AND gate, receiving a restoring signal and the $1^{st}$ bit signal;
a first OR gate, controlling the $2^{nd}$ selection switch according to outputs of the second AND gate and the third AND gate;

the $3^{rd}$ control unit comprises:
a fourth AND gate, receiving the voltage-down signal and the $3^{rd}$ bit signal;
a fifth AND gate, receiving the restoring signal and the $2^{nd}$ bit signal;
a second OR gate, controlling the $3^{rd}$ selection switch according to outputs of the fourth AND gate and the fifth AND gate;

the $j^{th}$ control unit, in which j is a positive integer, and $4 \leq j \leq (N-3)$, comprises:
a sixth AND gate, receiving the voltage-down signal and the $j^{th}$ bit signal;
a seventh AND gate, receiving the restoring signal and the $(j-1)^{th}$ bit signal;
an eighth AND gate, receiving a voltage-up signal and the $(j-2)^{th}$ bit signal;
a third OR gate, controlling the $j^{th}$ selection switch according to outputs of the sixth AND gate, the seventh AND gate, and the eighth AND gate;

the $(N-2)^{th}$ control unit comprises:
a ninth AND gate, receiving the restoring signal and the $(N-3)^{th}$ bit signal;
a tenth AND gate, receiving the voltage-up signal and the $(N-4)^{th}$ bit signal; and
a fourth OR gate, controlling the $(N-2)^{th}$ selection switch according to outputs of the ninth AND gate and the tenth AND gate;

the $(N-1)^{th}$ control unit comprises:
an eleventh AND gate, receiving the restoring signal and the $(N-2)^{th}$ bit signal;
a twelfth AND gate, receiving the voltage-up signal and the $(N-3)^{th}$ bit signal;

a fifth OR gate, controlling the $(N-1)^{th}$ selection switch according to outputs of the eleventh AND gate and the twelfth AND gate; and the $N^{th}$ control unit comprises:
a thirteenth AND gate, controlling the $N^{th}$ selection switch according to the voltage-up signal and the $(N-2)^{th}$ bit signal.

8. The DAC as claimed in claim 4, wherein the selection unit comprises:
a specific selection unit, having a plurality of switches, coupled between the reference voltages and the detection unit, for selecting a conduction path according to the input digital signal to output the specific reference voltage;
a regulation switch group, having a plurality of regulation switches, coupled to the upper limit voltage, the lower limit voltage and the reference voltages, for selectively turning on the regulation switches according to the regulation signal; and
a bit switch group, having a plurality of bit switches, coupled between the regulation switch group and the first output terminal of the selection unit, for selectively turning on the bit switches according to the input digital signal;
wherein the regulation switch group and the bit switch group form a conduction path according to the regulation signal and the input digital signal to regulate the overdrive voltage.

9. The DAC as claimed in claim 3, wherein the detection unit comprises:
a first detection circuit, outputting a first detection voltage and a second detection voltage according to the specific reference voltage and the output voltage;
a second detection circuit, outputting a third detection voltage and a fourth detection voltage according to the specific reference voltage and the output voltage;
a voltage-up circuit, outputting the voltage-up signal according to the second detection voltage and the third detection voltage;
a voltage-down circuit, outputting the voltage-down signal according to the first detection voltage and the fourth detection voltage; and
a restoring circuit outputting the restoring signal according to the voltage-up signal and the voltage-down signal.

10. The DAC as claimed in claim 9, wherein the first detection circuit comprises:
a current source;
a first PMOS transistor, having one end coupled to the current source and a gate coupled to the specific reference voltage;
a second PMOS transistor, having one end coupled to the current source and a gate coupled to the output voltage;
a first NMOS transistor, coupled between another end of the first PMOS transistor and a ground terminal; and
a second NMOS transistor, coupled between another end of the second PMOS transistor and the ground terminal, wherein gates of the second NMOS transistor and the first NMOS transistor are both coupled to a DC bias;
wherein a common node of the first PMOS transistor and the first NMOS transistor outputs the first detection voltage, and a common node of the second PMOS transistor and the second NMOS transistor outputs the second detection voltage.

11. The DAC as claimed in claim 10, wherein if the specific reference voltage is higher than the output voltage, the second detection voltage is enabled and the first detection voltage is disabled; if the specific reference voltage is lower than the output voltage, the first detection voltage is enabled and the second detection voltage is disabled; if the specific reference voltage equals to the output voltage, the first detection voltage and the second detection voltage are both disabled.

12. The DAC as claimed in claim 9, wherein the second detection circuit comprises:
a third PMOS transistor, having one end coupled to a working voltage;
a fourth PMOS transistor, having one end coupled to the working voltage, and gates of the third PMOS transistor and the fourth PMOS transistor are hot coupled to a DC bias;
a third NMOS transistor, coupled between another end of the third PMOS transistor and a current source, wherein a gate of the third NMOS transistor is coupled to the specific reference voltage; and
a fourth NMOS transistor, coupled between another end of the fourth PMOS transistor and the current source, wherein a gate of the fourth NMOS transistor is coupled to the output voltage;
wherein a common node of the third PMOS transistor and the third NMOS transistor outputs the third detection voltage, and a common node of the fourth PMOS transistor and the fourth NMOS transistor outputs the fourth detection voltage.

13. The DAC as claimed in claim 12, wherein if the specific reference voltage is higher than the output voltage, the fourth detection voltage is enabled and the third detection voltage is disabled; if the specific reference voltage is lower than the output voltage, the third detection voltage is enabled and the fourth detection voltage is disabled; if the specific reference voltage equals to the output voltage, the third detection voltage and the fourth detection voltage are both enabled.

14. The DAC as claimed in claim 9, wherein the voltage-up circuit comprises:
an inverter, for inverting the third detection voltage; and
an AND gate, for outputting the voltage-up signal according to an output of the inverter and the second detection voltage.

15. The DAC as claimed in claim 9, wherein the voltage-down circuit comprises:
an inverter, for inverting the fourth detection voltage; and
an AND gate, for outputting the voltage-down signal according to an output of the inverter and the first detection voltage.

16. The DAC as claimed in claim 9, wherein the restoring circuit comprises:
a first NMOS transistor, coupled between a current source and a ground terminal, wherein a gate of the first NMOS transistor is coupled to the voltage-up signal; and
a second NMOS transistor, coupled between the current source and the ground terminal, wherein a gate of the second NMOS transistor is coupled to the voltage-down signal;
wherein a common node of the first NMOS transistor, the second NMOS transistor, and the current source outputs the restoring signal, and the restoring signal is enabled when the voltage-up signal and the voltage-down signal are both disabled.

17. The DAC as claimed in claim 1, wherein the buffer unit comprises:
an operational amplifier, having a positive input terminal, a negative input terminal, and an output terminal, wherein the positive input terminal is coupled to the overdrive voltage, the output terminal is coupled to the negative input terminal, and the output terminal of the operational amplifier generates the output voltage.

18. A DAC, comprising:
a voltage divider unit, for providing an upper limit voltage a lower limit voltage, and a plurality of reference voltages between the upper limit voltage and the lower limit voltage;
a plurality of overdrive units, coupled to the voltage divider unit, for outputting a plurality of overdrive voltages; and
a plurality of buffer units, coupled to the plurality of overdrive units to generate a plurality of output voltages according to the plurality of overdrive voltages;
wherein the overdrive units compare the reference voltages corresponding to a plurality of input digital signals and the output voltages, and regulate the overdrive voltages, such that the output voltages correspond to the input digital signals.

19. The DAC as claimed in claim 18, wherein each of the overdrive units comprises:
a selection unit coupled to the voltage divider unit, comprising a first output terminal for outputting a specific overdrive voltage from among the overdrive voltages and a second output terminal for outputting a specific reference voltage corresponding to the input digital signals from among the reference voltages; and
a detection unit, coupled to the selection unit and one of the buffer units, for comparing a specific output voltage among the output voltages and the corresponding specific reference voltage and outputting a regulation signal to the selection unit;
wherein the selection unit regulates the corresponding specific overdrive voltage according to the regulation signal and the input digital signals such that the specific output voltage corresponds to the input digital signals.

20. The DAC as claimed in claim 19, wherein the selection unit makes the specific overdrive voltage higher than the specific reference voltage when the specific output voltage is lower than the specific reference voltage; the selection unit makes the specific overdrive voltage lower than the specific reference voltage when the specific output voltage is higher than the specific reference voltage; and the selection unit makes the specific overdrive voltage equal to the specific reference voltage when the output voltage equals to the specific reference voltage.

21. A DAC, comprising:
a voltage divider unit, for providing an upper limit voltage, a lower limit voltage and a plurality of reference voltages between the upper limit voltage and the lower limit voltage;
a plurality of overdrive units, coupled to the voltage divider unit, for outputting a plurality of overdrive voltages;
a plurality of buffer units, coupled to the plurality of overdrive units, for generating a plurality of first output voltages according to the plurality of overdrive voltages; and
a decoding unit, coupled to the buffer units, for receiving the first output voltages, and outputting a plurality of second output voltages according to the input digital signals, wherein each of the second output voltages is one of the first output voltages;
wherein the overdrive units compare the first output voltages and the corresponding reference voltages to regulate the overdrive voltages such that the second output voltages correspond to the input digital signals.

22. The DAC as claimed in claim 21, wherein the decoding unit comprises:
a plurality of decoders, wherein each of the decoders is coupled to the first output voltages, and outputs one of the corresponding second output voltages according to the input digital signals.

23. The DAC as claimed in claim 21, wherein each of the overdrive units comprises:
a selection unit, coupled to the voltage divider unit, comprising an output terminal used for outputting a specific overdrive voltage from among the overdrive voltages; and
a detection unit, coupled to the selection unit and one of the buffer units, for comparing the specific output voltage from among the first output voltages and the corresponding reference voltage and outputting a regulation signal to the selection unit;
wherein the selection unit regulates the specific overdrive voltage according to the regulation signal such that the second output voltage corresponds to the input digital signals.

24. The DAC as claimed in claim 23, wherein the selection unit makes the specific overdrive voltage higher than the reference voltage when the first output voltage is lower than the corresponding reference voltage; the selection unit makes the specific overdrive voltage lower than the reference voltage when the first output voltage is higher than the corresponding reference voltage; and the selection unit makes the specific overdrive voltage equal to the reference voltage when the first output voltage equals to the corresponding reference voltage.

25. A source driver, comprising:
a driving unit, for outputting a plurality of digital signals according to a plurality of input display signals; and
a DAC, coupled to the driving unit, for generating a plurality of output voltages according to the digital signals;
wherein each of the digital signals correspond to one of the reference voltages, the DAC compares the reference voltages corresponding to the digital signals and the output voltages to output a plurality of regulation signals, and wherein the DAC further outputs a plurality of overdrive voltages according to the regulation signals and the digital signals, and the DAC regulates the output voltages according to the overdrive voltages such that the output voltages correspond to the reference voltages corresponding to the digital signals.

26. The source driver as claimed in claim 25, wherein the DAC comprises:
a voltage divider unit, for providing an upper limit voltage, a lower limit voltage, and the reference voltages between the upper limit voltage and the lower limit voltage;
a plurality of overdrive units, coupled to the voltage divider unit, for outputting the plurality of overdrive voltages; and
a plurality of buffer units, coupled to the plurality of overdrive units, for generating the output voltages according to the plurality of overdrive voltages;
wherein the overdrive units compare the corresponding reference voltages and the output voltages according to the digital signals, and regulate the overdrive voltages, such that the output voltages correspond to the digital signals.

27. The source driver as claimed in claim 26, wherein each of the overdrive units comprises:
a selection unit, coupled to the voltage divider unit, comprising a first output terminal for outputting a specific overdrive voltage from among the overdrive voltages and a second output terminal for outputting a specific reference voltage corresponding to the digital signal from among the reference voltages; and
a detection unit, coupled to the selection unit and one of the buffer units, for comparing a specific output voltage among the output voltages and the corresponding specific reference voltage, and outputting a regulation signal to the selection unit;
wherein the selection unit regulates the specific overdrive voltage according to the regulation signal and the digital signals, such that the specific output voltage is corresponding to the digital signals.

28. The source driver as claimed in claim 27, wherein the selection unit makes the specific overdrive voltage higher than the specific reference voltage when the specific output voltage is lower than the specific reference voltage; the selection unit makes the specific overdrive voltage lower than the specific reference voltage when the specific output voltage is higher than the specific reference voltage; and the selection unit makes the specific overdrive voltage equal to the specific reference voltage when the output voltage equals to the specific reference voltage.

29. The source driver as claimed in claim 25, wherein the DAC comprises:
a voltage divider unit, for providing an upper limit voltage, a lower limit voltage, and a plurality of reference voltages between the upper limit voltage and the lower limit voltage;
a plurality of overdrive units, coupled to the voltage divider unit, for outputting the plurality of overdrive voltages;
a plurality of buffer units, coupled to the plurality of overdrive units, for generating a plurality of first output voltages according to the plurality of overdrive voltages;
a decoding unit, coupled to the buffer units, for receiving the first output voltages, and generating the output voltages according to the digital signals, wherein each of the output voltages is one of the first output voltages;
wherein the overdrive units compare the first output voltages and the corresponding reference voltages to regulate the overdrive voltages such that the output voltages correspond to the digital signals.

30. The source driver as claimed in claim 29, wherein the decoding unit comprises:
a plurality of decoders, each of the decoders being coupled to the first output voltages, and correspondingly outputting one of the output voltages according to the digital signals.

31. The source driver as claimed in claim 30, wherein each of the overdrive units comprises:
a selection unit, coupled to the voltage divider unit, comprising an output terminal used to output a specific overdrive voltage from among the overdrive voltages; and
a detection unit, coupled to the voltage divider unit and one of the buffer units, for comparing a specific output voltage from among the first output voltages and the corresponding reference voltage, and outputting a regulation signal to the selection unit;
wherein the selection unit regulates the specific overdrive voltage according to the regulation signal, such that the output voltage corresponds to the digital signals.

32. The source driver as claimed in claim 31, wherein the selection unit makes the specific overdrive voltage higher than the reference voltage when the first output voltage is lower than the corresponding reference voltage; the selection unit makes the specific overdrive voltage lower than the reference voltage when the first output voltage is higher than the corresponding reference voltage; and the selection unit makes the specific overdrive voltage equal to the reference voltage when the first output voltage equals to the corresponding reference voltage.

33. The source driver as claimed in claim 25, wherein the driving unit comprises:
- a shift register, for generating a shift signal;
- a first latch, coupled to the shift register, for receiving and latching a display signal according to the shift signal;
- a second latch, coupled to the first latch, for latching and outputting the signal output from the first latch; and
- a level shifter, coupled to the second latch, for receiving and regulating a voltage level of the signal output from the second latch, and outputting the digital signal.

34. A digital-to-analog conversion method, comprising:
providing an upper limit voltage, a lower limit voltage and a plurality of reference voltages between the upper limit voltage and the lower limit voltage;

generating a corresponding specific reference voltage according to an input digital signal, wherein the specific reference voltage is one of the reference voltages;

comparing the output voltage and the specific reference voltage, and outputting a regulation signal, and outputting an overdrive voltage according to the regulation signal and the input digital signal; and regulating the output voltage according to the overdrive voltage such that the output voltage corresponds to the input digital signal.

35. The digital-to-analog conversion method as claimed in claim 34, wherein in the step of outputting the overdrive voltage according to the regulation signal and the input digital signal, if the output voltage is lower than the specific reference signal, the overdrive voltage is higher than the specific reference voltage; if the output voltage is higher than the specific reference voltage, the overdrive voltage is lower than the specific reference voltage; and if the output voltage equals to the specific reference voltage, the overdrive voltage is equal to the specific reference voltage.

* * * * *